(12) United States Patent
Wang et al.

(10) Patent No.: US 6,252,309 B1
(45) Date of Patent: Jun. 26, 2001

(54) PACKAGED SEMICONDUCTOR SUBSTRATE

(75) Inventors: Wu-Chang Wang; Yung-I Yeh, both of Kaohsiung; Kun-Ching Chen, Tainan; Shyh-Ing Wu, Kaohsiung Hsien, all of (TW)

(73) Assignee: Advanced Semiconductor Engineering, Inc. (TW)

( * ) Notice: Subject to any disclaimer, the term of this patent is extended or adjusted under 35 U.S.C. 154(b) by 0 days.

(21) Appl. No.: 09/227,580

(22) Filed: Jan. 8, 1999

(51) Int. Cl.$^7$ ................................................. H01L 23/28
(52) U.S. Cl. ............................................ 257/787; 257/729
(58) Field of Search ................................. 257/730, 787, 257/729, 703

(56) References Cited

U.S. PATENT DOCUMENTS 5,635,671 * 6/1997 Freyman et al. ..................... 257/787
5,886,398 * 3/1999 Low et al. ............................. 257/730

* cited by examiner

Primary Examiner—Roy Potter

(57) ABSTRACT

A packaged semi-conductor substrate includes a package encapsulant pouring area, a layout provided on the substrate, a layer of solder mask deposited on the layout, and a film provided on the solder mask. When the package encapsulant is pouted into the package encapsulant pouring area, the package encapsulant is isolated from the solder mask by the film. An adhering force between the film and the package encapsulant is greater than an adhering force between the film and the mask such that the film is degated along with the package encapsulant in the pouring channel during a degating procedure of the pouring channel after a pouring procedure of the package encapsulant. Thus, the film and the package encapsulant are not residual on the substrate.

3 Claims, 2 Drawing Sheets

PACKAGED SEMICONDUCTOR SUBSTRATE

BACKGROUND OF THE INVENTION

1 Field of the Invention

The present invention relates to a packaged semiconductor substrate, and more particularly to a degatable electrically insulating layer provided between the position for pouring the package encapsulant and the substrate to prevent direct contact between the package encapsulant and the substrate surface at the position for pouring the package encapsulant during manufacture of a substrate for a ball grid array integrated circuit (BGA IC).

2. Description of the Related Art

Conventional quad flat pack (QFP) and pin-grid array (PGA) methods for packaging integrated circuits cannot meet practical needs as the functions of integrated circuits have become more and more complicated while the integration level of the circuits become higher and higher. Ball grid array integrated circuit (BGA IC) packaging method is one of the newly developed methods for ICs with a quantity of pins and is suitable for packaging ultra-large scale integration (ULSI) produced by submicron solution.

Referring to FIG. 1A, when proceeding with plastic BGA packaging that is common in BGA ICs, a mold (not shown) is put on top of the substrate 11 of a BGA IC (an electronic device 10 to be packaged), and molten liquid plastic material (i.e., a package encapsulant) is then poured into the mold to completely enclose the integrated circuits on the substrate 11 to thereby provide a completely air tight seal for the integrated circuit chips. Referring to FIG. 1B, the BGA IC (the packaged electronic device 10) is removed from the mold after the plastic material is hardened. Subsequent trim work is carried out on an area adjacent a mold gate (not shown) of the mold to remove the residual plastic material in a pouring channel (not shown) of the mold. In the above-mentioned packaging method for BGA ICs, a metallic plate 13 (FIG. 2) is provided on the substrate 11 and includes a metallic surface formed by depositing gold on a side thereof. When the substrate is covered by the mold, the metallic surface is located below the pouring channel of the mold. The metallic surface serves as an isolating layer between the substrate and the pouring channel during pouring of the package encapsulant, thereby providing an increased degating ability. More specifically, when removing the substrate from the mold, the metallic surface allows the residual package encapsulant in the pouring channel to be easily degated from the substrate. Thus, the residual on the packaged IC can be easily trimmed. Nevertheless, in addition to an increased cost as a result of using gold, the metallic plate occupies a certain space and thus reduces the space available for layout. Furthermore, as shown in FIG. 2, when the metallic plate 13 is expanded as a result of heat, the solder masks 15 on both sides of the metallic plate 13 are squeezed in the lateral direction such that the layout 14 in each solder mask 15 is also squeezed. As a result, the product defective index is increased.

SUMMARY OF THE INVENTION

It is a primary object of the present invention to provide a packaged semi-conductor substrate without the conventional mold gate. A film is mounted in the package encapsulant position to form a layer that is degatable along with the pouring channel. As a result, the film and the package encapsulant will not be residual on the substrate. The substrate of the present invention may increase the space available for the layout and lower manufacturing cost as no gold is required. Thus, a crowded layout on the substrate is avoided and the product defective index is lowered. In addition, the degating ability between the position for pouring the package encapsulant and the package encapsulant is not affected.

In accordance with the present invention, the substrate includes a film provided to the position for pouring package encapsulant. The film has an adhesive force so as to be adhered to the position for pouring package encapsulant. The layout is located below the film, while a layer of solder mask is deposited on the layout. When the package encapsulant is poured into the position for pouring package encapsulant, the package encapsulant does not directly contact with the solder mask by means of an isolation effect provided by the film. In this case, an adhering force is generated between the package encapsulant in the pouring channel and the film such that the film can be adhered to the package encapsulant in the pouring channel. An adhering force between the film and the package encapsulant is greater than an adhering force between the film and the mask such that the film is degated along with the package encapsulant in the pouring channel during a degating procedure of the pouring channel after a pouring procedure of the package encapsulant. Thus, the film and the package encapsulant are not residual on the substrate.

Other objects, advantages, and novel features of the invention will become more apparent from the following detailed description when taken in conjunction with the accompanying drawings.

DETAILED DESCRIPTION OF THE PREFERRED EMBODIMENT

Figure 1A:
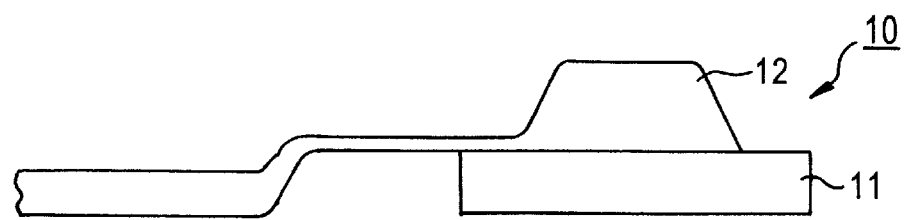
FIG. 1A is a schematic side view illustrating pouring of package encapsulant on an electronic device to be packaged according to the prior art.
Figure 1B:
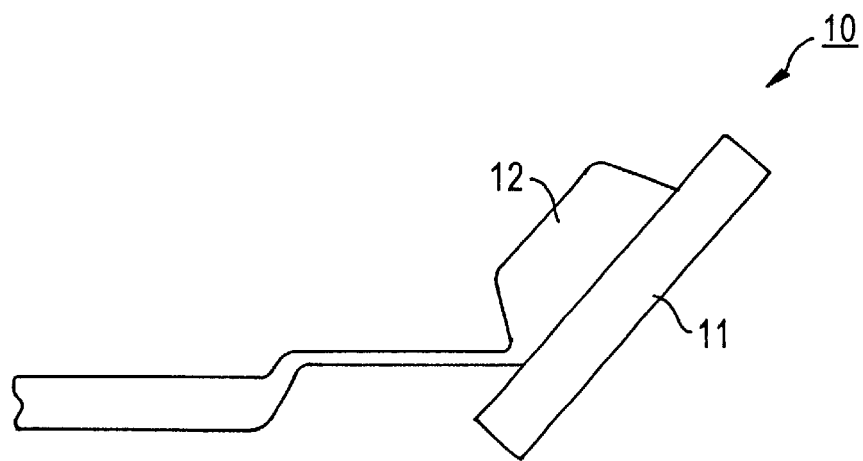
FIG. 1B is a schematic side view illustrating removal of the packaged electronic device from the mold according to the prior art.
Figure 2:
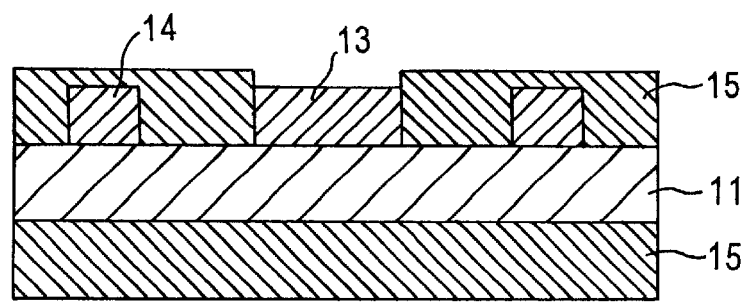
FIG. 2 is a partial sectional view illustrating the mold gate area of the packaged electronic device according to the prior art.
Figure 3:
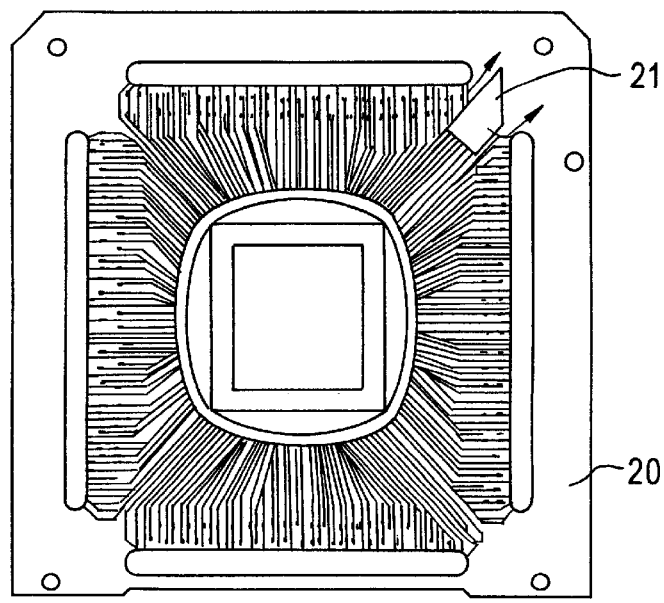
FIG. 3 is a top view of an upper side of a substrate in accordance with the present invention.
Figure 4:
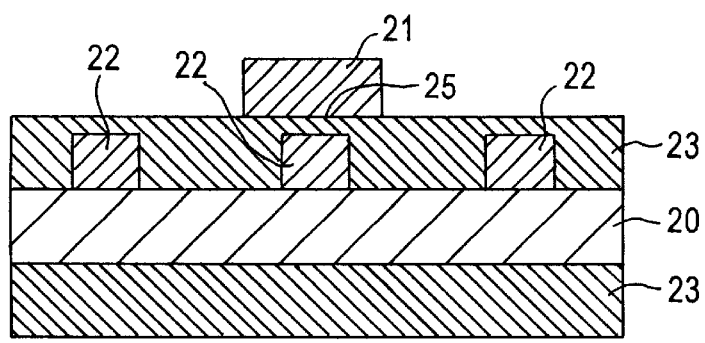
FIG. 4 a sectional view taken along line 4—4 in FIG. 3.

Referring to FIG. 3, a substrate 20 in accordance with the present invention includes a film 21 formed on an area of an upper side thereof, rather than the metallic plate deposited with gold to lower the cost. The film 21 may be made of non-metallic material, metallic material, an adhesive tape, or high molecular compound. Referring to FIG. 4, the substrate 20 includes a package encapsulant pouring area 25 in which the position for pouring the package encapsulant is around the package encapsulant. A layout 22 is provided below the package encapsulant pouring area 25. As shown in FIG. 4, the film 21 is provided in the package encapsulant pouring area 25 of the substrate 20. Preferably, the film 21 has an area identical to that of the package encapsulant pouring area 25 and has an adhesive force so as to be adhered to the package encapsulant pouring area 25. The layout 22 on the upper side of the substrate 20 is covered with a solder mask 23, and the film 21 is adhered to the solder mask 23. Thus, the area available for the layout 22 on the substrate 20 is increased, as the film 21 is adhered to the solder mask 23. In addition, the manufacture cost for the substrate 20 is reduced, as no metallic plate or gold is required. Furthermore, the problem of lateral squeeze to the layout on both sides of the substrate 20 as a result of expansion of the metallic plate is avoided, thereby improving the good product index.

Figure 5:
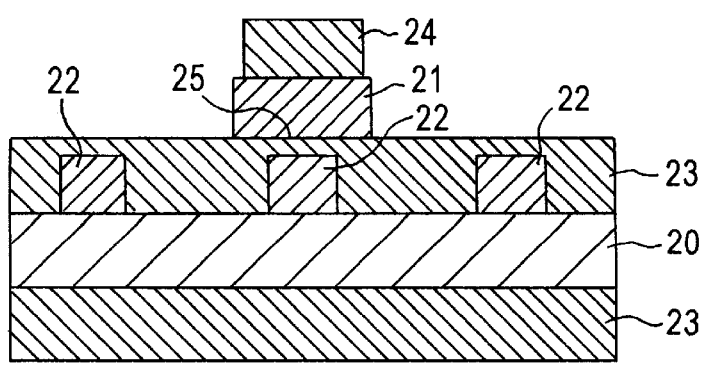
FIG. 5 is a sectional view similar to FIG. 4, illustrating the structure of the substrate after pouring of package encapsulant.

Referring to FIG. 5, when pouring the package encapsulant 24 into the package encapsulant pouring area 25, the package encapsulant 24 covers the package encapsulant pouring area 25 yet isolated by the film 21 such that the package encapsulant 24 does not contact with the solder mask 23 directly. Since the mold (not shown) keeps the package encapsulant 24 remain on the film 21 yet not extending beyond two sides of the film 21, the package encapsulant 24 will not be residual on both sides of the film 21. In this case, the package encapsulant 24 in the pouring channel (not shown) provides an adhering force such that the film 21 is adhered to the package encapsulant 24 in the pouring channel. The adhering force between the film 21 and the package encapsulant 24 is greater than the adhering force between the film 21 and the solder mask 23. When degating the pouring channel, the film 21 may be degated along with the package encapsulant 24 in the pouring channel. Thus, the film 21 and the package encapsulant 24 will not be residual on the solder mask 23 on the substrate 20. Accordingly, when packaging the substrate 20, the degatable layer (the film 21) can be degated at any time by an appropriate way. In this case, since the residual package encapsulant in the pouring channel is adhered to a surface of the degatable film 21, the residual package encapsulant 24 is also removed from the solder mask 23 on the substrate 20 when the film 21 is degated. The solder mask 23 is not damaged during the degating procedure.

Although the invention has been explained in relation to its preferred embodiment, it is to be understood that many other possible modifications and variations can be made without departing from the spirit and scope of the invention as hereinafter claimed.

What is claimed is:

1. A packaged semiconductor substrate comprising:
    a substrate having a surface and a package encapsulant pouring area into which a package encapsulant is poured, a solder mask being provided on the surface of the substrate;
    a film adhered to the solder mask on the package encapsulant area;
    wherein an adhering force between the film and the package encapsulant is greater than an adhering force between the film and the solder mask, whereby the film is degated along with the package encapsulant in a pouring channel during degating procedure of the pouring channel after a pouring procedure of the package encapsulant;
    wherein the film is an adhesive tape made of non-metallic material.

2. The packaged semiconductor substrate as claimed in claim 1, wherein the film is made of non-metallic high molecular compound.

3. A packaged semiconductor substrate comprising:
    a substrate having a surface and a package encapsulant pouring area into which a package encapsulant is poured, a solder mask being provided on the surface of the substrate;
    a film adhered to the solder mask on the package encapsulant area;
    wherein an adhering force between the film and the package encapsulant is greater than an adhering force between the film and the solder mask, whereby the film is degated along with the package encapsulant in a pouring channel during degating procedure of the pouring channel after a pouring procedure of the package encapsulant;
    wherein the film is a non-metallic film.

* * * * *